United States Patent [19]

Inoue et al.

[11] Patent Number: 5,430,375

[45] Date of Patent: Jul. 4, 1995

[54] POSITION DETECTING APPARATUS USING MAGNETO-RESISTANCE EFFECT ELEMENT

[75] Inventors: Norikatsu Inoue, Tokyo; Kazutaka Noborimoto, Kanagawa; Kunio Nakazato, Kanagawa; Toshiyuki Kase, Kanagawa, all of Japan

[73] Assignee: Sony Corporation, Tokyo, Japan

[21] Appl. No.: 279,862

[22] Filed: Jul. 26, 1994

Related U.S. Application Data

[63] Continuation of Ser. No. 10,993, Jan. 29, 1993, abandoned.

[30] Foreign Application Priority Data

Feb. 7, 1992 [JP] Japan .................................. 4-056131

[51] Int. Cl.$^6$ .................................. G01B 7/00; G01P 3/42
[52] U.S. Cl. .................................. 324/207.21; 324/207.24; 359/698; 359/824
[58] Field of Search .................................. 359/696, 697, 698, 823, 359/824, 825; 324/207.21, 207.24, 226; 354/195.12, 195.1, 400

[56] References Cited

U.S. PATENT DOCUMENTS

| | | | |
|---|---|---|---|
| 4,429,276 | 1/1984 | Narimatsu et al. | 324/207.21 |
| 4,740,064 | 4/1988 | Kono et al. | 359/697 |
| 4,818,939 | 4/1989 | Takahashi et al. | 324/207.24 |
| 4,904,937 | 2/1990 | Takahashi et al. | 324/207.21 |
| 5,055,781 | 10/1991 | Sakakibara et al. | 324/207.21 |
| 5,200,776 | 4/1993 | Sakamoto | 354/195.12 |

FOREIGN PATENT DOCUMENTS

| | | | |
|---|---|---|---|
| 101786 | 5/1988 | Japan | 324/207.21 |
| 15609 | 1/1992 | Japan | 359/696 |
| 66909 | 3/1992 | Japan | 359/698 |
| 172411 | 6/1992 | Japan | 359/698 |

Primary Examiner—Edward K. Look
Assistant Examiner—James A. Larson
Attorney, Agent, or Firm—Hill, Steadman & Simpson

[57] ABSTRACT

A position detecting apparatus comprising a magnet secured to a movable body (lens holder) which is movable along a shaft body when the shaft body is inserted, the magnet having polarity which is alternately magnetized at a predetermined interval, and a magneto-resistance effect element which is positioned and fixed so as to be confronted to the magnet at a predetermined gap interval by an MR holder with the shaft body being used as a securing position reference, and the magneto-resistance effect element serving to obtain a position detection signal for the movable body through variation of a resistance value thereof which is caused by magnetic field of the magnet through movement of the movable body.

1 Claim, 10 Drawing Sheets

FIG.6
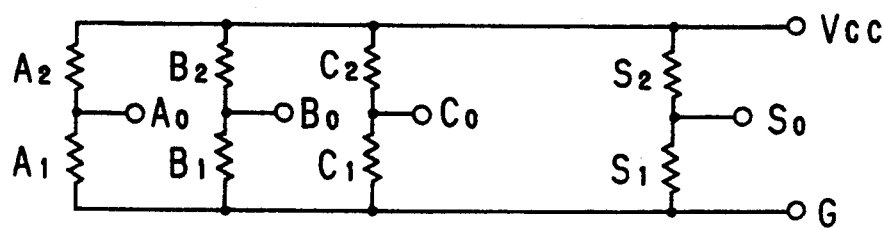
FIG.7a
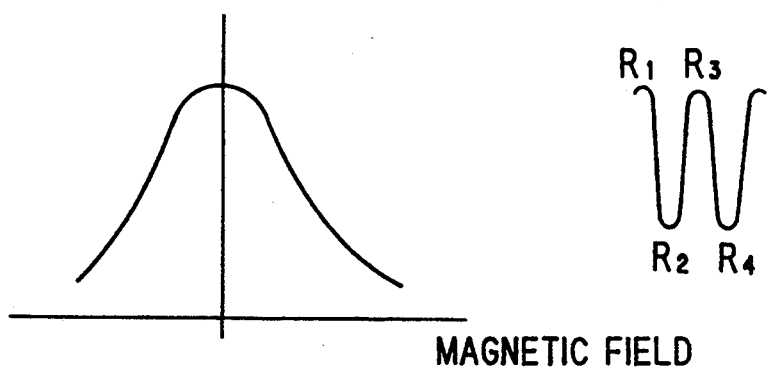
MAGNETIC RESISTANCE
MAGNETIC FIELD
FIG.7b
FIG.7c
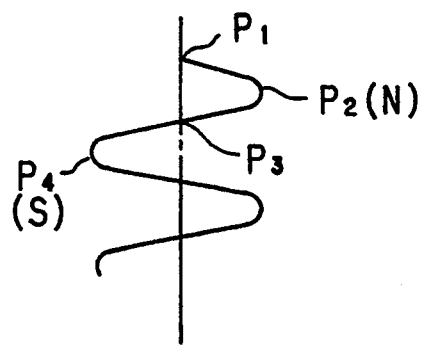

POSITION DETECTING APPARATUS USING MAGNETO-RESISTANCE EFFECT ELEMENT

This is a continuation, of application Ser. No. 08/010,993, filed Jan. 29, 1993, abandoned.

BACKGROUND OF THE INVENTION

1. Field of the Invention

This invention relates to a position detecting apparatus for detecting the position of an object, and particularly to the construction of a position detecting apparatus using a magneto-resistance effect (MR) element which is suitable for position detection with high resolution.

2. Description of Related Art

A position detection with high resolution is required for a zoom lens or focus lens equipped in a video camera, for example.

A lens-barrel of the video camera is constructed by plural lens systems containing a zoom lens and a focus lens to perform a zoom function and a focus function. For example, four groups of lens systems are provided to the lens-barrel. The lens systems of first and third groups are fixedly disposed while the zoom lens system serving as a second group is disposed movably in an optical axis direction, and the focus lens system for focusing, compensation and imaging operations are likewise disposed movably in the optical axis direction. The zoom lens is driven by a stepping motor for example, and the focus lens is driven by a voice coil motor.

In such a video camera, a position control is carried out such that the position of the focus lens is varied in correspondence to the movement of the zoom lens so that an imaging position is fixed at all times. Particularly in "Manual Zoom Tracking" mode that the zoom lens is manually moved, the focus lens must be moved in such a manner as to trace along a predetermined focus, so that the position control of the focus lens is required to be carried out with precision of about 20 $\mu$m. In order to satisfy such a requirement, this applicant has proposed an MR type position detecting apparatus capable of carrying out position detection with high precision.

The MR type position detecting apparatus comprises a magnet having polarity which is alternately magnetized at a minute interval of 150 to 400 $\mu$m, and an MR element whose resistance value is varied in response to the magnetic field of the magnet, and a higher-precise position detection signal can be obtained by finding a magnetization pitch pattern of the magnet or the MR element.

In the MR type position detecting apparatus as described above, the magnet is usually secured to a movable body, for example, a lens holder for supporting the focus lens, and the MR element is fixed to a fixed side, for example, a predetermined portion of the lens-barrel. The magnet and the MR element are disposed so as to be confronted to each other at a predetermined gap interval when the movable body is located at a predetermined position within a movable range.

Here, it is preferable to accurately adjust the gap interval because the gap interval affects the output voltage of the MR element. For example, for the magnet having a magnetization pitch of 264 $\mu$m, it is apparent from FIG. 16 that the gap interval must be set to 0.08 to 0.18 mm to obtain an output above 40 mV from the MR element.

However, it has been substantially impossible to keep the gap interval between the confronting magnet and MR element to a predetermined value because of accumulated tolerance of respective parts which are used in the MR element.

Therefore, the MR type position detecting apparatus as described above has the following problems. A complicated gap adjustment mechanism is further required, and thus the construction is more complicated. In addition, a gap adjustment work is required for each set after a fabrication process of desired parts, and thus a manufacturing process is ineffective.

SUMMARY OF THE INVENTION

This invention is implemented to overcome the above problems of the conventional position detecting apparatus, and a position detecting apparatus according to this invention comprises a guide member for movably supporting a moving member, a magnet which is secured to the moving member and has magnetic poles alternately magnetized at predetermined intervals, a magneto-resistance effect element having magneto-detectors for a plurality of phases successively disposed a predetermined distance apart, a support means, mounted to the guide member, for fixing the magneto-resistance effect element so as to be confronted to the magnet at a predetermined interval, so that the magneto-resistance effect element obtains position detection signals for the moving member through variation of a resistance value thereof which is caused by magnetic field of the magnet through movement of the moving member.

The magneto-resistance effect element, that is, the support means to which the magneto-resistance effect element is fixed is directly positioned by the guide member, so that the magneto-resistance effect element can be positioned with high precision relatively to the other parts which are also positioned by the guide member. That is, the mutual position precision in the confronting state between the magneto-resistance effect element and the magnet movable along the guide member can be improved.

BRIEF DESCRIPTION OF THE DRAWINGS

FIG. 6 is a equivalent circuit diagram of the MR element;

FIGS. 7(a)–(c) are characteristic graphs showing the operation principle of a magnetic detector;

DETAILED DESCRIPTION OF PREFERRED EMBODIMENTS

An embodiment of the position detecting apparatus according to this invention will be hereunder described with reference to FIGS. 1 to 13. In this embodiment, the position detecting apparatus of this invention is applied as position detecting means for a focus lens of a video camera.

Figure 1:
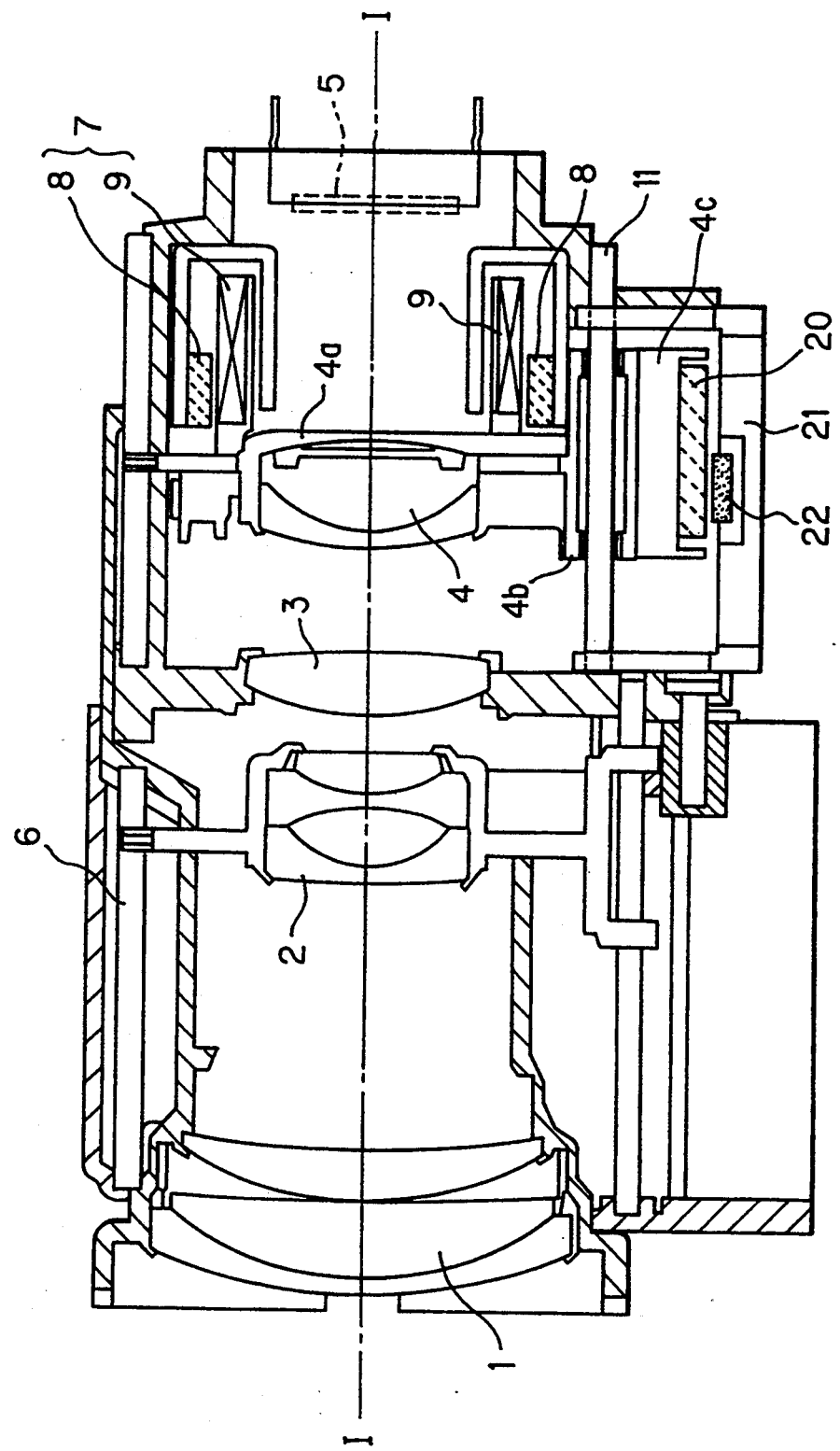
FIG. 1 is a schematic view of an embodiment in which a position detecting apparatus of this invention is applied to a lens-barrel.
Figure 2:
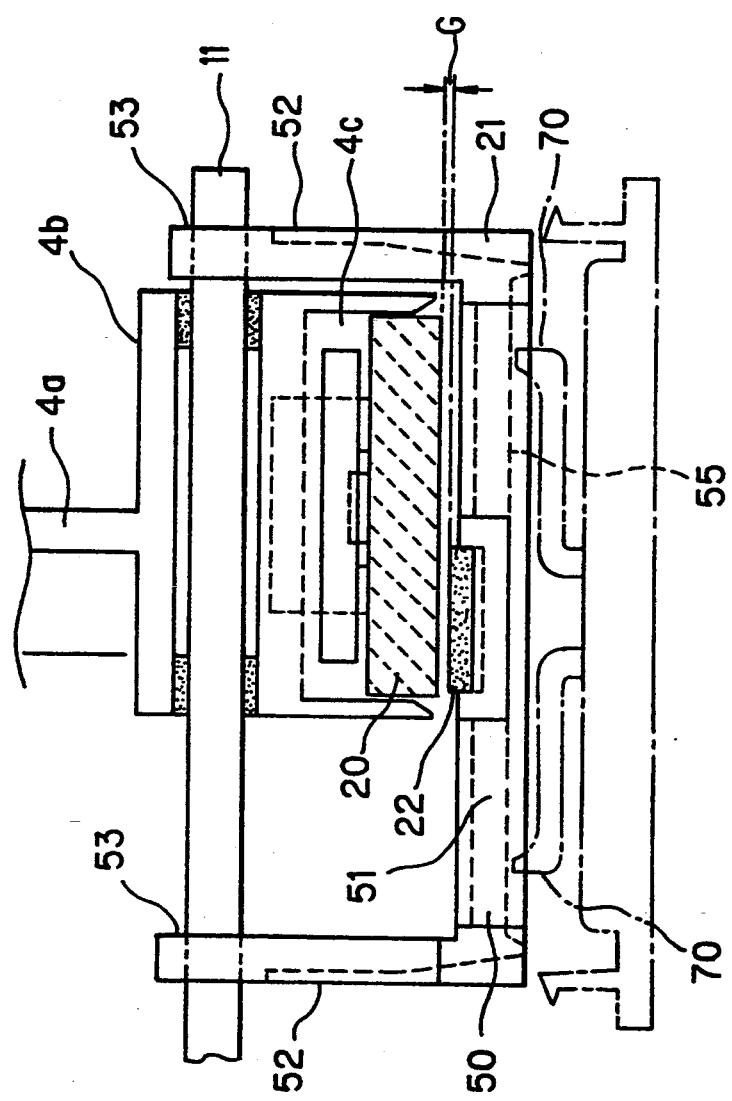
FIG. 2 is schematic view of a main part of this embodiment.

FIG. 1 is a schematic diagram showing the construction of a lens system of a video camera which has the position detecting apparatus of this embodiment, and FIG. 2 is a schematic diagram of the construction of a main part.

In FIG. 1, along an optical axis I—I from the front side to the rear side of the camera lens-barrel are disposed a first group lens 1 for focus, a second group lens 2 for zoom, a third group lens 3 for compensation, and a fourth group lens 4 for focus, and at a focusing position of the fourth group lens is disposed a CCD image pick-up element.

The first group lens and the third group lens 3 are respectively fixed to predetermined positions in the lens-barrel while the second group lens 2 and the fourth group lens 4 are secured movably along the optical axis I—I in forward and rearward directions.

The second group lens 2 is linked to the output shaft of a stepping motor (as not shown) through a lead screw 6, and it is propelled forwardly and rearwardly by rotating the stepping motor forwardly and backwardly, respectively. The fourth group lens 4 is linked to a voice coil motor comprising a permanent magnet 8 and a electromagnetic coil 9 provided on a lens holder 4a, and its forward and rearward propulsion is controlled by controlling a current supply amount to the coil 9 and a supply current polarity.

The position detecting apparatus of this embodiment is mounted so as to detect the position of the fourth group lens 4 for focus.

The fourth group lens 4 is inserted with a shaft 11 (hereinafter referred to as "reference shaft") parallel to the optical axis I—I at a bearing portion 4b of the lens holder 4a, and it is supported so as to be movable forwardly and rearwardly in the barrel. The bearing 4b is provided with a magnet holder 4c, and a magnet 20 is secured to the magnet holder 4c. Therefore, when the lens holder 4a for supporting the fourth group lens 4 is moved along the optical axis I—I on the reference shaft 11, the magnet 20 is also moved in parallel to the reference shaft 11.

The reference shaft 11 is provided with a substantially U-shaped MR holder 21, and an MR element 22 is fixed on the surface of the MR holder 21 which confronts the magnet 20. Therefore, with the movement of the lens holder 4a, the magnet 20 is parallel moved in confronting relation with the MR element 22 as indicated by an arrow of FIG. 4 while keeping a predetermined gap interval G between the magnet 20 and the MR element 22.

The position detecting operation of the magnet 20 and the MR element 22 which constitute the position detecting apparatus of this embodiment will be hereunder described.

Figure 4:
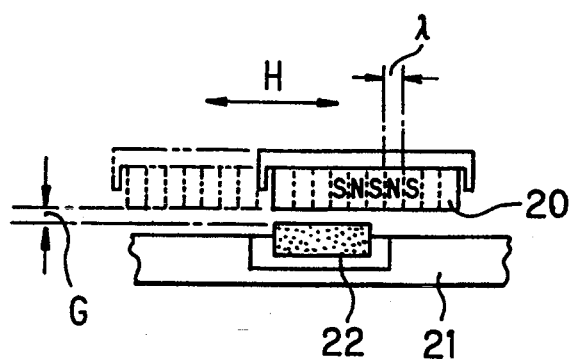
FIG. 4 is an explanatory diagram of a position detecting operation of the MR element.

As shown in FIG. 4, the magnet 20 have plural pairs of N and S magnetic poles which are alternately magnetized at a magnetization width of $\lambda$ (for example, $\lambda=150$ $\mu m$) in its longitudinal direction.

Figure 5:
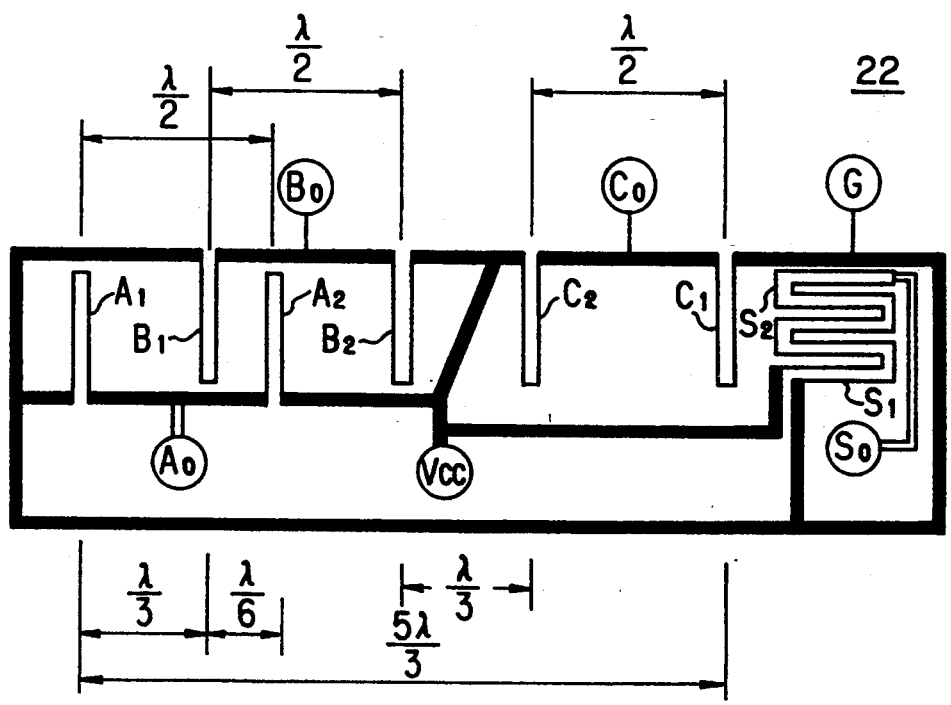
FIG. 5 is a schematic view showing the construction of the MR element.

FIG. 5 shows the details of the MR element 22. The MR element 22 outputs a three-phase position variation signal in response to the movement of the magnetic pole formation width (magnetization width) $\lambda$, and thus the MR element 22 has three pairs of magnetic detection elements $A_1$ and $A_2$, $B_1$ and $B_2$ and $C_1$ and $C_2$. Each magnetic detection element, for example, $A_1$ is formed as two lines which are obtained by subjecting a ferromagnetic film, for example, a iron-nickel film or cobalt-nickel film to a sputtering or etching process to form a fine line of 500 to 1000 Å and returning it into two lines. The width of the return line is set to 10 $\mu m$, for example.

The magnetic detection elements $A_1$, $A_2$, $B_1$, $B_2$, $C_1$ and $C_2$ are elongated in a direction intersecting (perpendicular to) the direction of magnetic field of the magnet 20 so that the resistance values thereof are varied in accordance with the magnetic field from the magnet 20. On the other hand, a line (as indicated by a heavy line in FIG. 5) which is formed of the same ferromagnetic film as the magnetic detection element and serves to connect the magnetic detection elements is formed so as to be thicker in the direction parallel to the direction of the magnetic field of the magnet 20, for example, with a width of 100 $\mu m$ so that no variation in resistance values occur.

Each pair of the magnetic detection elements $A_1$ and $A_2$, $B_1$ and $B_2$ and $C_1$ and $C_2$ are spaced at a half interval of the magnetic pole formation width $\lambda$, that is, $\lambda/2$ in the magnet 20. The first-phase magnetic detection element $A_1$ and the second-phase magnetic detection element $B_1$ are formed so as to be spaced at an interval of $\lambda/3$, and the first-phase magnetic detection element $A_1$ and the third-phase magnetic detection element $C_1$ are formed so as to be spaced at an interval of one cycle plus $2\lambda/3$, that is, $5\lambda/3$.

The arrangement of the third-phase magnetic detection element $C_1$ and $C_2$ is opposite to that of the first-phase and second-phase magnetic detection elements. The second-phase magnetic detection element $B_2$ and the third-phase magnetic detection element $C_2$ are formed at an interval of $\lambda/3$.

As described above, three-phase position detecting signals having phase difference of 120 degrees therebetween are output by the magnetic detection elements for the respective phases.

The paired magnetic detection elements for each phase, for example, the first-phase magnetic detection elements $A_1$ and $A_2$ are connected to each other through the heavy connecting line as shown, and an output terminal $A_0$ is formed at the center portion of the connecting line.

In order to detect the variation in resistance of the magnetic detection elements as voltage variation, a terminal for applying a power source voltage Vcc and an earth terminal G are formed.

In order to obtain a reference voltage Vcc/2 which is a half of the power source voltage Vcc, the magnetic detection elements $S_1$ and $S_2$ are formed in alignment with each other so as to elongate in a direction parallel to the magnetic field of the magnet 20 and offset the effect of the magnetic field of the magnet 20 on the elements $S_1$ and $S_2$, so that the effect of the magnetic field of the magnet 20 can be reduced as much as possible. An output terminal $S_0$ is also formed at an intermediate connection point between the magnetic detection elements $S_1$ and $S_2$.

A slanting connection line for connecting the power source voltage terminal Vcc and the magnetic detection element $C_2$ is formed so as to avoid the effect of the magnetic field of the magnet 20. The width of this slantly-formed connection line is equal to the magnetic pole formation width $\lambda$, and the connection line is preferably located where it is not effected by the magnetic field of the magnet 20.

FIG. 6 is an equivalent circuit diagram of the MR element 22 as shown in FIG. 5. The magnetic detection elements for each phase, for example, the elements $A_1$ and $A_2$ for the first phase are connected in series between the terminal for applying the power source voltage Vcc and the earth terminal G, and the output terminal $A_0$ is connected at the intermediate point between the elements $A_1$ and $A_2$, so that the voltage of the output terminal $A_0$ with respect to the earth terminal G is output as a first-phase position detection signal. Further, the reference voltage of Vcc/2 which is a half voltage of the power source voltage Vcc is output from the output terminal $S_0$ at the intermediate point between the magnetic detection elements $S_1$ and $S_2$ at all times.

FIG. 7 is a characteristic graph showing the operation principle of the magnetic detection element $A_1$. When the magnetic field as shown in FIG. 7(c) is applied, the resistance value of the magnetic detection element is varied in accordance with its characteristic as shown in FIG. 7(a). When no magnetic field is applied (point $P_1$ of FIG. 7(c)), the resistance is not varied (point $R_1$ of FIG. 7(b)), and when the magnetic field of the N pole is maximum (point $P_2$ of FIG. 7(c)), the reduction of the resistance value is maximum (point $R_2$ of FIG. 7(b)). Further, when no magnetic field is applied again (point $P_3$ of FIG. 7(c)), the resistance is not varied (point $R_3$ of FIG. 7(b)), and when the magnetic field of the S pole is maximum (point $P_4$ of FIG. 7(c)), the reduction of the resistance value is maximum (point $R_4$ of FIG. 7(b)).

The operation of the paired magnetic detection elements ($A_1$ and $A_2$) as described above will be described with reference to FIGS. 8 and 9.

Figure 8A:
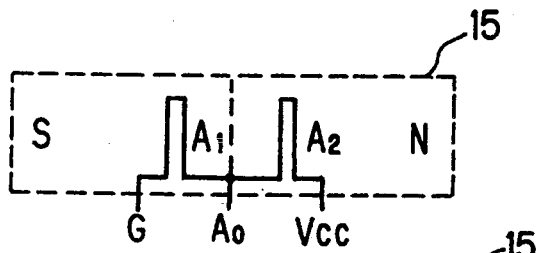
FIGS. 8(a)–(c) are explanatory diagrams of the operation of the magnetic detector.
Figure 8B:
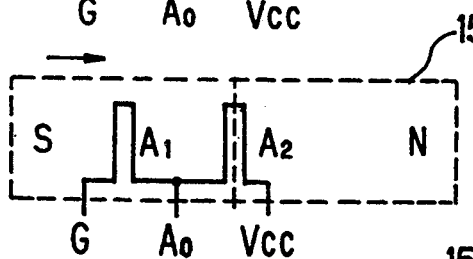
Figure 8C:
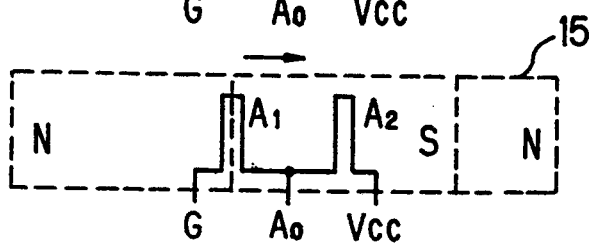
Figure 9:
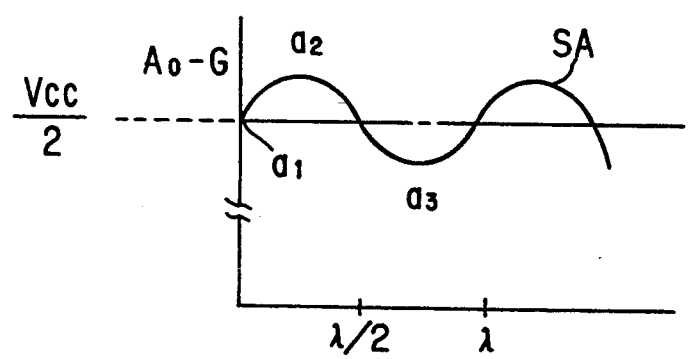
FIG. 9 is an explanatory diagram of the output signal of the magnetic detector.

For the positional relationship between the magnet 20 and the magnetic detection elements $A_1$ and $A_2$ as shown in FIGS. 8(a) to (c), the voltage output at the output terminal $A_0$ has amplitude as indicated by point $a_1$, $a_2$ and $a_3$ of FIG. 9, respectively. That is, when the intermediate point between the magnetic detection elements $A_1$ and $A_2$ is located at the boundary line between N and S poles of the magnet 20 as shown in FIG. 8(a), the magnetic forces applied to both magnetic detection elements are equal to each other, and thus the resistance values thereof are equal to each other, so that the average voltage Vcc/2 is output from the output terminal $A_0$. However, upon movement of the magnet 20 as shown in FIG. 8(b), the magnetic detection element $A_2$ is located on the boundary of the magnetic poles, and suffers strong magnetic field in a direction parallel to the pattern width of the magnetization sensing portion, so that the resistance is greatly reduced, and the output voltage is higher than Vcc/2. The operation for the positional relationship as shown in FIG. 8(c) is converse to that of FIG. 8(b).

Accordingly, when the magnet 20 is moved relatively to the magnetic detection elements $A_1$ and $A_2$), the output at the output terminal $A_0$ has a sinusoidal (or cosine-wave) signal whose amplitude is fluctuated upwardly and downwardly with the average (reference) voltage of Vcc/2 at the center thereof.

Figure 10:
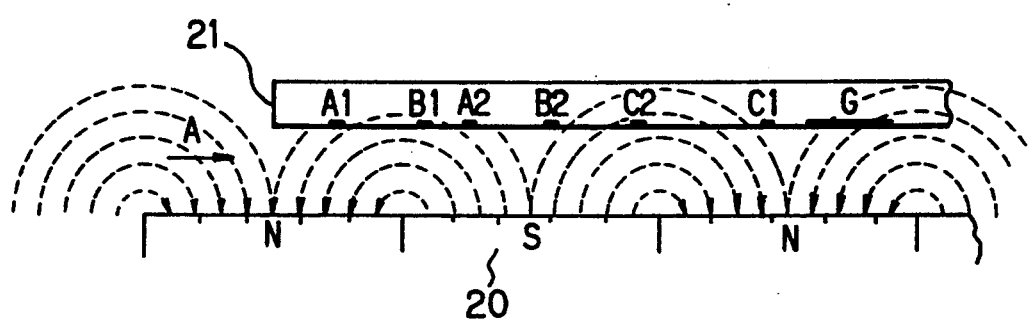
FIG. 10 is an explanatory diagram of the position detecting operation of the MR element.
Figure 11:
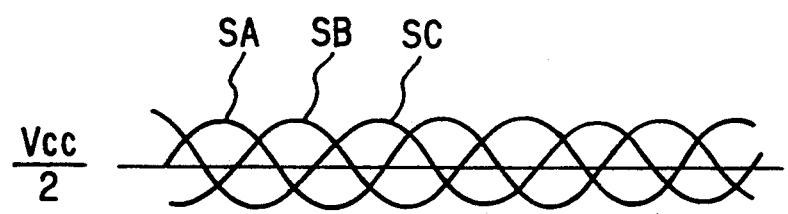
FIG. 11 is an explanatory diagram of the output signal of each magnetic detector in the MR element.

When the N and S magnetic poles of the magnet 20 are confronted to the magnetic detection elements of the MR elements and the N and S magnetic poles of the magnet 20 are moved relatively to the magnetic detection elements ($A_1$, $A_2$, $B_1$, $B_2$, $C_1$, $C_2$) as shown in FIG. 10, the position detection signals SA, SB and SC for the respective phases are upwardly and downwardly fluctuated in amplitude with the reference voltage of Vcc/2 at the fluctuation center as shown in FIG. 11, and becomes three-phase detection signals each having phase difference of 120 degrees.

Figure 12:
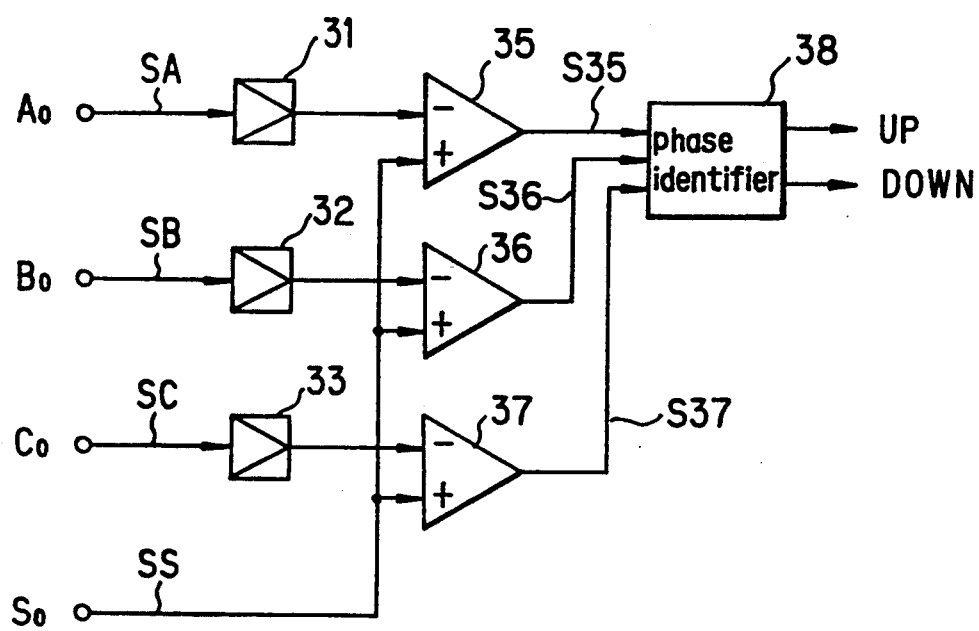
FIG. 12 is a circuit diagram for the position detecting operation.

By obtaining the three-phase position detection signals from the MR element 22, the position of the magnet 20, that is, the lens holder 4a can be detected with a position detection signal processing circuit as shown in FIG. 12.

The output terminals $A_0$, $B_0$ and $c_0$ of the magnetic detection elements are connected to the inversion input terminals (−) of comparators 35 to 37 through buffer amplifiers 31 to 33 respectively, and the output terminal $S_0$ for outputting the reference voltage of Vcc/2 is connected to the non-inversion input terminals (+) of the comparators 35 to 37.

Each of the outputs of the comparators 35 to 37 has a high level "H" when each of the voltages of the output terminal $A_0$, $B_0$ and $C_0$ is higher than the reference voltage Vcc/2 of the output terminal $S_0$, and has a low level when each voltage is lower than the reference voltage Vcc/2. Therefore, the outputs S35 to S37 of the comparators 35 to 37 are varied as shown in FIG. 13 in accordance with the three-phase position detection signals.

A phase identifier 38 detects the positional variation and the moving direction of the magnet 20 on the basis of the "H" or "L" logical signals S35 to S37 from the comparators 35 to 37, and outputs an up-pulse UP when the magnet 20 is moved to the front side of the lens-barrel, and a down-pulse DOWN when the magnet 20 is moved to the rear side of the lens-barrel.

The judgment of the moving direction is performed by identifying the generation timings of two phases, for example, the first-phase comparison signal S35 and the second-phase comparison signal S36. That is, if the first-phase comparison signal S35 is generated earlier than the second-phase comparison signal S36, the magnet 20 is judged to be moved forwardly.

Figure 13:
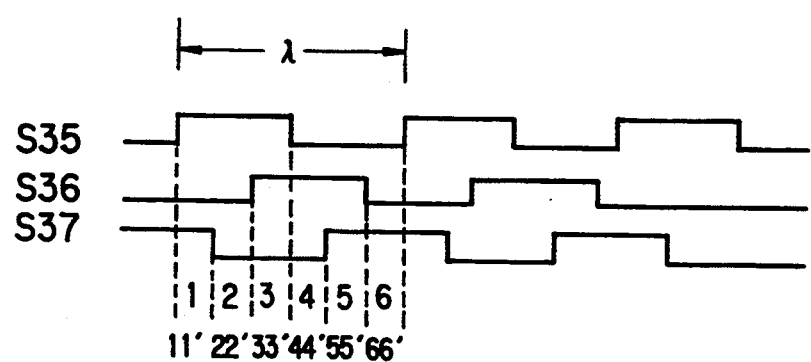
FIG. 13 is an explanatory diagram of the output of a counter for the position detecting operation.
Figures 14A, 14B, 14C:
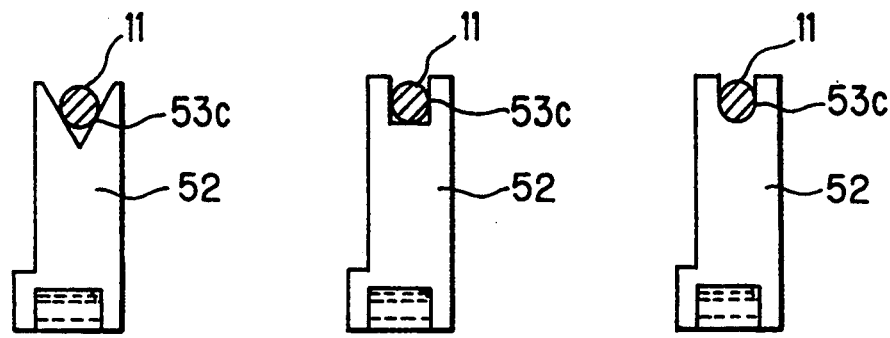
FIGS. 14(a)-(c) are explanatory diagrams of another embodiment of the MR holder.
Figure 15:
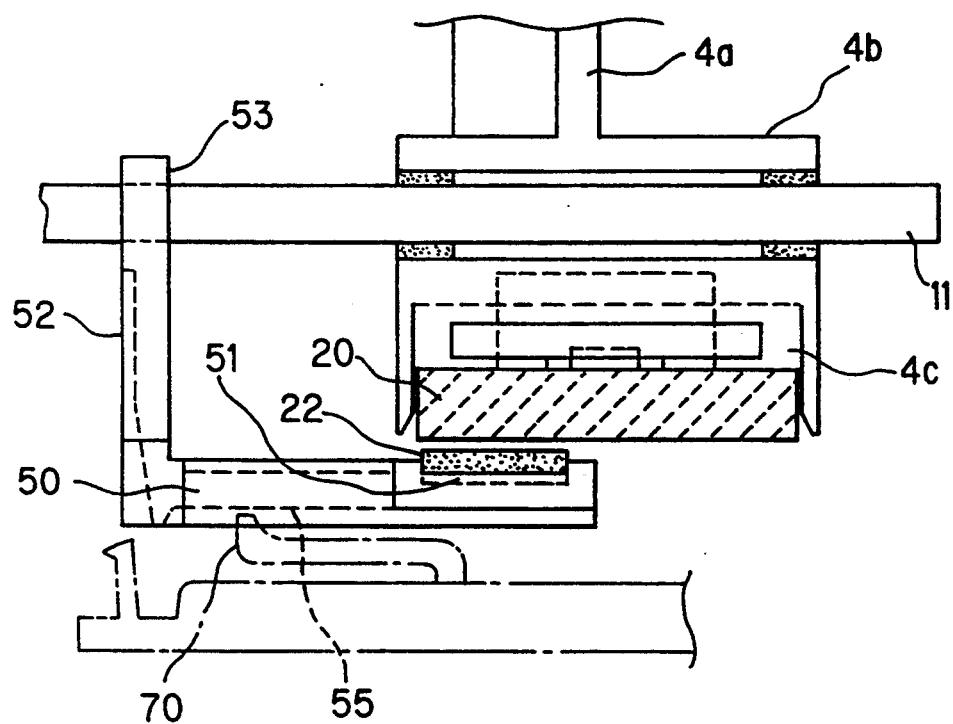
FIG. 15 is an explanatory diagram of another embodiment of the MR holder.
Figure 16:
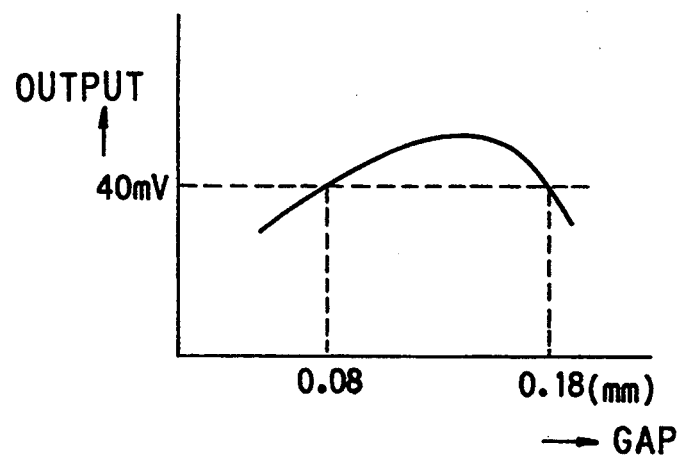
FIG. 16 is a graph of output-gap characteristic of the MR element.

As is apparent from FIG. 13, logical signals with which the magnetic pole formation width $\lambda$ is divided into six sections are obtained. Therefore, the phase identifier 38 identifies the moving direction of the magnet 20 on the basis of the logical signals, and outputs a pulse signal having such high revolution that the magnetic pole formation width $\lambda$ is divided into six sections.

If the magnetic pole formation width $\lambda$ in the magnet 20 is reduced, the position detection precision of the MR element 22 is improved. However, the reduction of the magnetic pole formation width $\lambda$ has a limitation, and the limitation of the width is about 150 $\mu$m, for example. However, if the pulse signal for dividing the magnetic pole formation width into six sections can be obtained with the three-phase magnetic detection elements, the resolution of the position detection pulse (UP/DOWN) which is output from the phase identifier 38 is 25 μm.

In addition, in the phase identifier 38, the potentials of the first-phase output terminal $A_0$ and the second-phase output terminal $B_0$, the potentials of the second-phase output terminal $B_0$ and the third-phase output terminal $C_0$, and the potentials of the third-phase output terminal $C_0$ and the first-phase output terminal $A_0$ are respectively compared with each other to further divide each of the six sections into two sections, and thus finally divide the magnetic pole formation width λ into 12 sections. That is, by the position detecting apparatus using the MR element and the magnet 20 as described above, a position detection pulse having extremely-high precision which indicates the moving direction with a resolution of 12.5 μm can be obtained.

Of course, in order to properly obtain such a high position detection precision, the gap G between the magnet 20 and the MR element 22 is required to be properly managed.

Here, in the position detecting apparatus of this embodiment, the MR element 22 is mounted on the MR holder 21 as shown in FIGS. 1 and 2, and the MR holder 21 is positioned and fixed to the reference shaft 11 which is inserted into the bearing 4b of the lens holder 4a.

The MR holder 21 is formed in a shape as shown in the front view, plan view, bottom view and side view in FIGS. 3(a) to (d), and is formed of resin, for example.

A reference numeral 50 represents a body portion equipped with a mount portion 51 into which the MR element 22 is mounted, and a reference numeral 52 represents an arm portion extending in an U-shape which is provided at each of both sides.

The tip of the arm portion 52 has a securing portion 53 for supporting the reference shaft 11 in a state where the reference shaft 11 is engaged with the securing portion 53. That is, the tip of the arm portion 52 is formed with a cutout portion with which the reference shaft 11 is engaged, and a pawl portion 53b for supporting the reference shaft 11 engaged with the cutout portion 53a to prevent the reference shaft 11 from falling off.

In addition, a slit 54 is formed so as to be in communication with the cutout portion 53a, and the pawl portion 53b is elastically urged into its opening and closing direction by the slit 54.

Therefore, by pushing the securing portions 53 of both of the arm portions 52 against the reference shaft 11, the pawl portion 53a is opened, and the reference shaft 11 is engaged with the cutout portion 53a. That is, the MR holder 21 is mounted on the reference shaft 11.

As is apparent from FIGS. 3(a) and (c), grooves 55 are formed at the bottom surface of the MR holder 21. Portions 70 of an external block as indicated by a one-dotted line of FIG. 2 are pushed against the grooves 55 in engagement with the grooves 55. Through this engagement, the MR holder 21 is prevented from rotating around the reference shaft 11 when the MR holder 21 is mounted on the reference shaft 11.

On the other hand, the magnet holder 4c to which the magnet 20 is fixed is formed so as to be continuous to the bearing 4b as shown in FIG. 2. The mount position of the bearing 4b is specified by the reference shaft 11.

That is, the position detecting apparatus of this embodiment is so designed that the mount positions of the magnet 20 and the MR element 22 are specified using the reference shaft 11 as a positioning reference, and thus the relative positional relationship between the magnet 20 and the MR element 22 is highly precisely kept using the reference shaft 11 serving as the positioning reference with no effect upon the total or accumulated tolerance of the securing parts.

Therefore, the interval of the gap G between the magnet 20 and the MR element 22 can be managed with high precision without adjusting the gap interval. In addition, since the gap adjustment is not required, the adjusting mechanism is not required to be newly added, and the adjusting process is also omitted, so that the effectiveness of the manufacturing can be promoted. Of course, the securing work of the MR element 22 (i.e., the MR holder 21 to which the MR element 22 is fixed) is performed by merely pushing the tip 21b of the arm portion 21a against the reference shaft, and thus it is very easily performed, so that the working performance can be improved.

Further, since the gap variation to time variation and temperature variation is small, the fluctuation of the output of the MR element 22 becomes small, and thus a stable detection operation can be realized.

Figure 3:
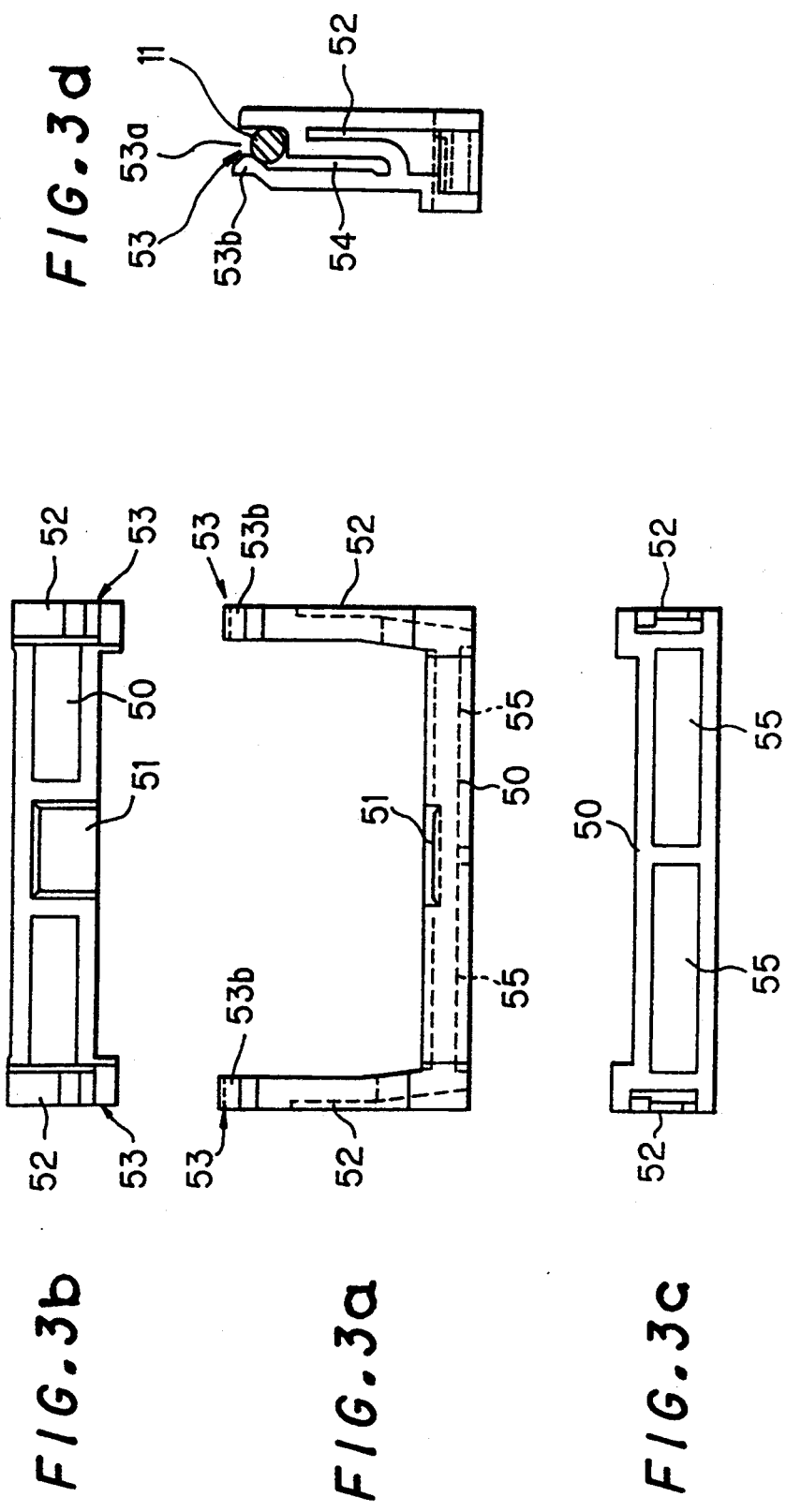
FIGS. 3(a), (b), (c) and (d) are front view, plan view, bottom view and side view of an MR holder of this embodiment.

The shape of the MR holder is not limited to that of FIG. 3. For example, the tip of the arm portion 52 for grasping the reference shaft may be formed with only the engaging portion 53c for the reference shaft 11, for example, may be formed in V-shape, -shape, U-shaped or the like. When these shapes are adopted, the engaging portion 53c functions as a contact portion for positioning, and it does not function to hold the reference shaft. Therefore, means for pushing the MR holder 21 itself against the reference shaft 11 is further required.

If the MR holder has sufficient strength, the arm portion 52 may be provided to only one side of the body portion 50.

This invention is usable as position detecting means for not only the lens system of the video camera, but also various apparatuses.

As described above, according to the position detecting apparatus of this invention, since the magnet is integrally secured to the movable body into which the shaft body is inserted and the mount position of the MR element is determined through the MR holder using the shaft body, the relative positional relationship between the magnet and the MR element does not suffer the effect of the total or accumulated tolerance of various linked parts, and thus the gap interval can be managed with high precision even if it is unadjusted.

Therefore, the gap precision is improved, and dispersion of the output of the MR element is reduced, so that reliability as a position detecting apparatus can be improved. In addition, the addition of the gap adjusting mechanism and the adjusting mechanism are simplified, and the reduction of cost can be promoted by reducing the number of processes and the number of parts.

What is claimed is:

1. A magneto-resistance effect position detecting device for detecting movement between first and second members which are mounted so as to move parallel to each other, a magnet mounted on said first member and with having a plurality of alternating poles whcih extend in the longitudinal direction and each pole has a width of λ, a magneto-resistance effect element mounted on said second member and comprising, a plurality of pairs of magneto-detectors, each of said plurality of pairs of magneto-detectors comprise first and second magneto-detector elements which are spaced $\lambda/2$ apart, the spacing between a first element of a first pair of said magneto-detectors and a first element of a second pair of said magneto-detectors being $2\lambda/6$, the spacing between said first element of said first pair of magneto-detectors and a first element of a third pair of said magneto-detectors being $10\lambda/6$, the spacing between said first element of said first pair of magneto-detectors and a second element of said second pair of magneto-detectors being $5\lambda/6$, the spacing between said first element of said first pair of said magneto-detectors and a second element of said third pair of a magneto-detectors being $7\lambda/6$, said first and second elements of each of said plurality of pairs of magneto-detectors connected in series between a voltage source and ground, a pair of reference voltage magnetic detector elements connected in series between said voltage source and ground, and an output terminal connected to a junction point between said pair of reference voltage magnetic detector elements, and said output terminal receiving a phase variable signal which indicates the relative position of said first and second members.

* * * * *